(12) United States Patent
Garner

(10) Patent No.: US 6,549,482 B2
(45) Date of Patent: Apr. 15, 2003

(54) METHOD AND APPARATUS TO PROVIDE REAL-TIME ACCESS TO FLASH MEMORY FEATURES

(75) Inventor: Richard P. Garner, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/815,767

(22) Filed: Mar. 23, 2001

(65) Prior Publication Data

US 2002/0136078 A1 Sep. 26, 2002

(51) Int. Cl.⁷ .............................................. G11C 8/00
(52) U.S. Cl. ........................... 365/230.03; 365/189.01; 365/189.04
(58) Field of Search ...................... 365/230.03, 185.33, 365/189.01, 189.04, 230.06, 189.05, 230.08

(56) References Cited

U.S. PATENT DOCUMENTS 5,546,561 A * 8/1996 Kynett et al. ............... 365/195
6,031,757 A * 2/2000 Chuang et al. ........ 365/185.04
6,307,779 B1 * 10/2001 Roohparvar ........... 365/185.11

OTHER PUBLICATIONS

Intel Corporation, "3 Volt Advanced+ Boot Block Flash Memory"; Oct., 2000; pp 1–63.

* cited by examiner

Primary Examiner—David Nelms
Assistant Examiner—Thong Le
(74) Attorney, Agent, or Firm—Blakely, Sokoloff, Taylor & Zafman LLP

(57) ABSTRACT

A flash memory in which a memory mapped input/output unit is used to access flash memory data when a particular flash condition is encountered, which condition is not a flash read command instruction to read the flash memory. A control logic is used to access the memory mapped input/output in order to respond to the particular flash condition when the condition is encountered. The memory mapped input/output allows real time access to the flash data without writing a read command to the flash memory.

33 Claims, 6 Drawing Sheets

| Register | Size | Description |
| --- | --- | --- |
| Alternate Status | 1 byte | Alternate "read status" register for Write Next and Copy. |
| | | |
| Write Address | 4 bytes | Holds the destination Flash address for Write and Copy. |
| Write Next | 1-2 bytes | Program data to Write Address, update status, increment Write Address. |
| Write Hold | 1-2 bytes | Program data to Write Address, update status. |
| | | |
| Read Address | 4 bytes | Holds the source Flash address for Read Next and Copy. |
| Read Next | 1-2 bytes | Data is read at Read Address and Read Address is incremented. |
| | | |
| Copy | 1 byte | Copy Length bytes from Read Address to Write Address. |
| Length | 2-4 bytes | Holds the byte length for Copy. |
| | | |
| Find | 1 byte | Find command. |
| Start Address | 4 bytes | Flash address where the Find begins. Could use Read Address register. |
| Image | 4 bytes | Holds the value to find. |
| Image Mask | 4 bytes | Bit-field mask of Image to find. |
| Increment | 1-2 bytes | The byte boundaries to search during Find operation. |
| End Address | 4 bytes | End address of range for Find. |
| Stop Value | 4 bytes | Terminates the search if value is found during Find. |
| Instance Count | 1-2 bytes | The nth instance of Image to find. |
| Instances | 1-2 bytes | Return value of images found. |
| Ready Status | 1 byte | Indicates Write or Copy command is done. No bit masking is necessary. |
| Error Status | 1 byte | Indicates Write or Copy command had an error. No bit masking is necessary. |
| WSM State | 1 byte | Return the current WSM state and may pause in this state. A write releases the WSM. |

*FIG. 5*

METHOD AND APPARATUS TO PROVIDE REAL-TIME ACCESS TO FLASH MEMORY FEATURES

BACKGROUND OF THE INVENTION

1. Field of the Invention

The present invention relates to the field of memories and more particularly to a technique to provide real-time access to flash memory features by use of a memory mapped input/output plane.

2. Description of the Related Art

A flash memory is a non-volatile electrically erasable and electrically programmable read-only semiconductor memory. Once programmed, the flash memory retains the program data until the memory is erased. In a typical flash memory structure, several blocks of flash memory are configured together on a flash memory device. A variety of flash memory devices are known in the art, but generally, a flash memory device is comprised of a plurality of memory cells, in which each cell includes a metal oxide semiconductor (MOS) transistor. Each flash transistor cell includes an isolated or floating gate that is programmed typically by electron injection from the channel.

In one typical configuration, a flash memory is partitioned into a plurality of memory blocks and in which operations are performed on a selected block or blocks. For example, a block erase routine is performed on each given block to erase the memory cells of that block. In general practice, flash memory devices are electrically erased to reset the state of the cells of a given block. Subsequently, over-erased cells are repaired and all cells verified to ensure that the cells are not in an over-erased condition. Once this procedure has been performed the cells can then be programmed.

In a typical flash operation, the memory cells of a flash array (or block) are read to determine if a selected cell is either in a programmed or a non-programmed state. Generally, the programmed cells require a higher threshold voltage to activate so that with a properly selected voltage on the control grid of a flash cell, the cell will conduct or not conduct depending on the programmed/non-programmed state of the particular cell.

Because of the nonvolatile nature of flash memories, these memory devices are utilized in a number of products. For example, cellular phones utilize flash memory cells to store various programmed information which can be retained even when the phone is turned off. The programmed information will generally include program code for execution by a processor or a controller. In a typical initialization procedure, the processor or controller coupled to operate with the flash memory will generally access the flash memory to initiate a boot sequence. The boot sequence is then followed by an applications program, which is stored in the flash memory. One program will configure the flash memory according to various information/parameters associated with the flash device. Some or all of these parameters are written to particular locations in the flash to provide the flash configuration.

However, since prior art flash memory devices typically require specialized commands to perform a flash operation, these devices cannot read data from the flash array and write to the array at the same time. That is, when a flash is in the flash read mode reading code from the flash memory, it cannot write data to memory. Alternatively, when the flash device is in one of the other modes (such as a write mode), the flash cannot read from the flash array. Once the executable command is completed (or suspended in some instances), a read flash array command is written to the flash device to return the flash to the flash read mode. Accordingly, existing flash devices can either read from the flash memory array or perform some other executable operation (other than flash read) on memory, but the device cannot do both operations at the same time.

When the processor is executing code from flash in the read mode, the flash memory device needs to be switched to another mode first (typically by writing the corresponding command to the flash device), before other functions can be performed, such as writing to the flash memory. Thereafter, in order to read the stored data (such as the program code mentioned above), the flash device needs to be placed back into the flash read mode (by writing a flash read command to the flash device). In order to be able to execute the code from flash while having access to the flash memory to perform other functions, one prior art technique loads the flash data elsewhere, so that the code can be executed while other data locations can be accessed. Otherwise, constant switching between flash read and other modes is required to read data (for example, the flash code) normally present in the data array/blocks of the flash memory device.

For example, in order to configure the flash device, the processor executes the flash code to configure the device. Configuration parameters are mapped to designated locations in the flash memory. This procedure is sometimes referred to as mapping the configuration plane and is done during initialization of the flash device (such as at power on reset). One existing practice is to transfer the contents of the flash memory (including the code for configuring the flash device) to another storage device such as RAM (random access memory), so that the code can be executed from RAM. This way the flash code, which is now in RAM, can be read and executed by the processor while executable commands can operate on the flash device. This way, an executable command instruction to the flash device can be performed, while reading the code from RAM.

This is typically the routine followed when a flash device is initialized (such as at power on reset), in which the processor, after loading flash data to RAM, executes the code from RAM to access the flash memory to configure the flash device as part of the initialization. Accordingly, in one prior art technique, the data from the flash memory device is transferred to RAM to map the configuration plane, so that the flash device need not be repeatedly written to switch modes between flash read and other executable modes.

It is to be noted that performance would be improved significantly if a mechanism was present to allow a flash device to execute other command instructions while reading flash data from memory, without transferring the flash data to another memory device.

BRIEF DESCRIPTION OF THE DRAWINGS

FIG. 5 is a chart showing various registers that may be implemented within the MMIO portion of the flash memory embodying an embodiment of the present invention.

DETAILED DESCRIPTION OF THE INVENTION

Figure 1:
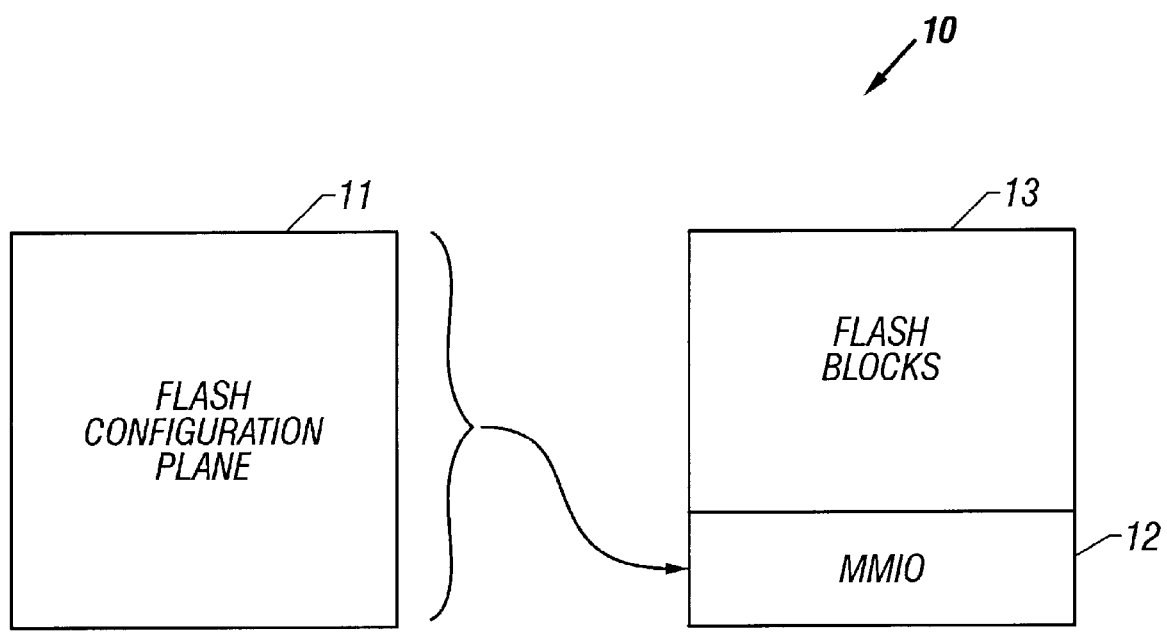
FIG. 1 is a block diagram showing a logical mapping of a flash configuration plane to a memory mapped input/output (MMIO) portion of a flash memory.

Referring to FIG. 1, a logical block diagram illustrating one embodiment of the present invention is shown. A logical representation of a flash configuration plane 11 is shown, which plane 11 includes data utilized to configure a flash memory 10. Generally, the configuration plane 11 is mapped during initialization of the flash memory 10, such as at power on reset. As noted in the background section above, prior art techniques typically will write the flash configuration code to other memory, such as RAM, in order for the flash memory to access flash data while executing code to configure the flash device. The loading of the flash code to RAM in the prior art technique allows the flash commands to access and configure features pertaining to the configuration of the device, without continually writing commands to the flash device to switch the flash device between flash read and non-flash read modes. A flash read mode herein is defined as a mode which allows reading of the data in the flash memory array/blocks.

In the practice of the present invention, as shown in the embodiment of FIG. 1, the flash configuration plane 11 is instead mapped to a memory mapped input/output (MMIO) portion of the flash memory 10. That is, the flash configuration plane 11 is mapped to a MMIO 12 of the flash memory 10. The MMIO 12 can be any part of the flash memory 10. However, in the embodiment shown in FIG. 1, the MMIO 12 is mapped as a portion of the flash memory blocks. That is, the MMIO 12 is mapped as one or more blocks of the plurality of flash blocks present. For simplicity of explanation, in the example of FIG. 1, the MMIO 12 is allocated as one block of the flash memory 10. The remaining blocks 13 are allocated for normal flash use.

It is to be noted that when the MMIO 12 is included within the flash memory device 10, no additional address lines are required since the address lines for addressing the flash memory blocks 13 can be utilized to access the MMIO 12. In one particular embodiment, the MMIO 12 is mapped to the last block. In another embodiment the MMIO 12 is mapped to the first block. Where the MMIO 12 is mapped is not critical to the practice of the invention, provided the MMIO 12 is mapped to some block other than the boot block at power up. Since the data pertaining to the flash configuration plane is mapped to the specific area designated as the MMIO plane, the MMIO 12 can be mapped as part of the boot up sequence during an initialization or reset procedure, such as power on reset. Since the MMIO 12 operates with dedicated hardware, including a register set, data can be written to and/or read from the MMIO 12 by utilizing addresses used for the flash memory. The MMIO 12 is thus used to indirectly access the flash memory when executing code for the flash configuration. As will be noted below in reference to FIG. 2, specialized registers and a state machine allow for execution of the flash commands to access flash data plane of blocks 13, without requiring the flash data to be loaded into RAM first.

Figure 2:
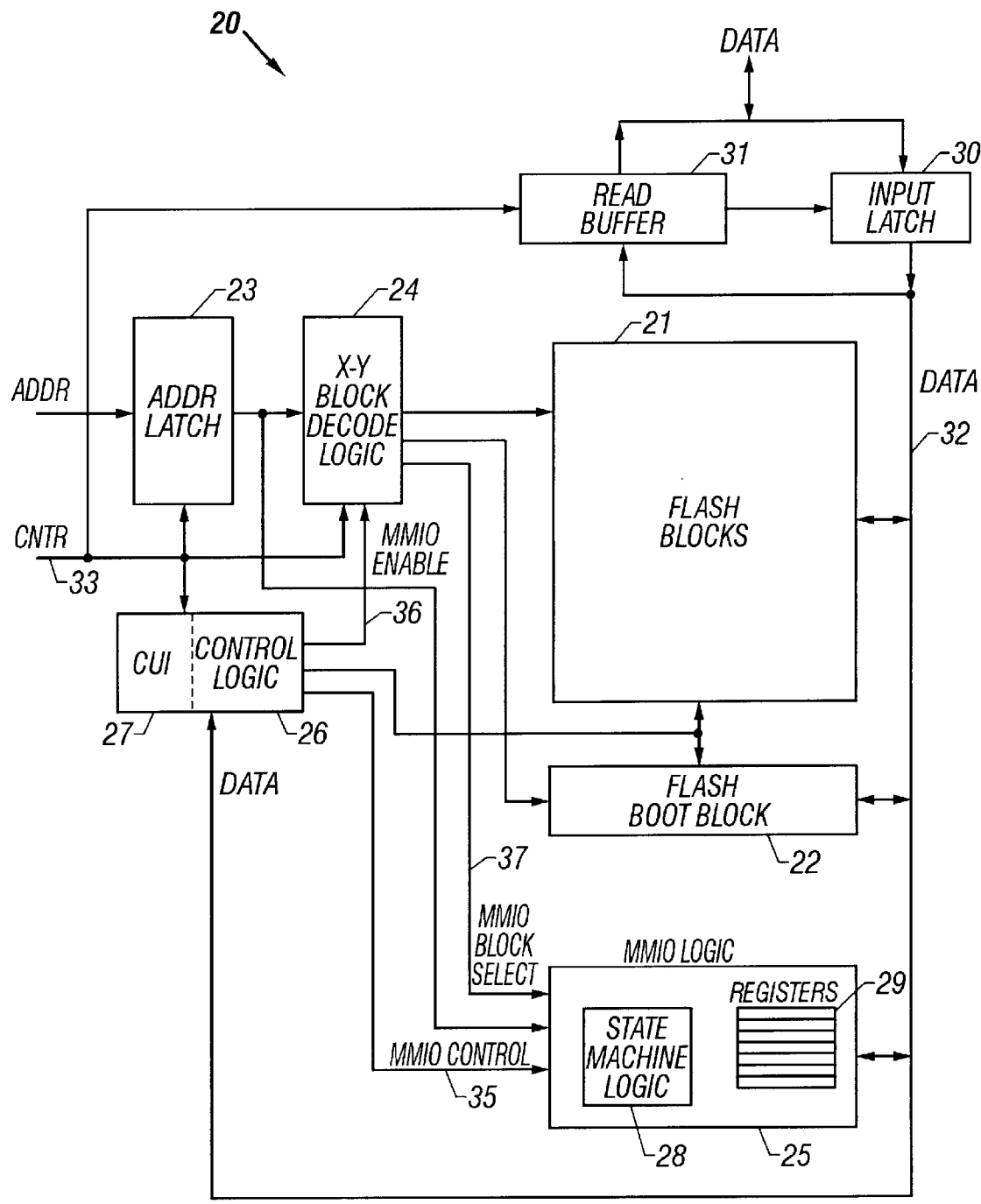
FIG. 2 is a block circuit diagram illustrating the various functional elements of a flash memory incorporating the MMIO of an embodiment of the present invention.

Referring to FIG. 2, a portion of a flash memory 20 applicable to an embodiment for the practice of the present invention is shown. The flash memory 20 is equivalent to the flash memory 10 of FIG. 1 and includes a plurality of flash memory blocks 21, as well as a portion of the memory allocated for a memory mapped I/O function. The MMIO plane 12 noted in FIG. 1 is accessed through the MMIO logic circuit 25 in FIG. 2. In the particular embodiment shown in FIG. 2, the portion of the flash memory 20 designated for the boot function is comprised of a single flash memory block 22. It is to be noted that the boot block 22 need not be of a single block size and can be actually smaller than a block or be of multiple blocks. However, the particular example shown uses one flash block for the boot block 22. In one embodiment, the boot block 22 has a size of 8 K bits.

In a typical operation of the flash memory 20, an address signal (shown as ADDR) is coupled into an address latch 23. The address signal once latched is coupled to a x-y block decode logic 24, as well as to the MMIO logic circuit 25. The x-y block decode logic 24 decodes the address signal and provides the x and y decoded signal for addressing the flash memory blocks 21, 22, as well as a block selection signal for selecting a particular block of the flash memory 20. As noted in FIG. 2, the outputs from the x-y block decode logic 24 are coupled to the flash blocks 21, the boot block 22 and the MMIO logic circuit 25.

The data is coupled to units 21, 22 and 25 through a data input latch 30 and data output from device 20 is coupled through a read buffer 31, which also operates as an output latch. A data bus 32 coupled to the various units 21, 22, 25, 30, 31 for data transfer is also coupled to a control logic unit 26 which includes a command user interface (CUI) 27.

The command user interface or CUI 27 is utilized to provide user interface to device 20 in which control signals present on control line 33 provide command signals to device 20. A flash command (shown as CNTR in FIG. 2) on line 33 is coupled to the address and data.latches 23, 30, 31, decode logic 24 and CUI 27/control logic 26 in order to provide various command instructions to the flash memory device 20. Various command instructions can be written to flash memory 20 on line 33 to command the flash device 20 to perform certain executable instructions, which instructions include those instructions known in the art, such as read, write and erase. The command or control signal is coupled to the CUI 27 to instruct the control logic circuit 26 to generate the necessary control signals for the operation of the various units within flash device 20.

The MMIO logic circuit 25 includes a state machine logic 28 and one or more MMIO registers 29. As will be noted below, the MMIO logic unit 25 is selected when the flash device 20 enters a command mode other than a flash read mode. The commands to be written to the flash are decoded by the CUI 27 and the control logic 26 generates corresponding control signals to execute the received command. It is generally at this stage that the prior art flash devices typically require the contents of the flash memory to be output to RAM so that command functions of the flash can be executed while retrieving flash data which has been loaded to the RAM. The configuration plane of the prior art flash devices is one example of the mapping of the configuration code to the RAM for executing commands pertaining to configuration of the device. The mapping of the data to RAM is done so that data can be read while executing a non-flash read command. Otherwise the flash memory would need to be placed in the flash read mode to read data from the flash array.

With the embodiment shown in FIG. 2, at least one command is utilized to activate the MMIO components within device 20. Utilizing the example in which the configuration plane is mapped, a flash command to enable the MMIO is initiated on the control line 33. For example, during power on reset, a reset signal on control line 33 is received by the CUI 27 and processed by the control logic 26. The reset command to the CUI 27 causes the control logic 26 to generate appropriate control signals to control the MMIO logic 25. This is noted by the MMIO Control signal on line 35 in FIG. 2. An MMIO Enable signal from the control logic 26 shown on line 36 causes the decode logic 24 to generate a MMIO Block Select signal on line 37 to select and enable the MMIO logic 25. That is, the MMIO logic 25 is inserted as the selected block for access by the address signal. The mapping in of the MMIO logic 25 can be achieved by replacing one of the existing flash blocks 21 or it can be a completely separate block. In one embodiment, an existing block is replaced by the MMIO logic 25, so that additional address lines are not needed. It is appreciated that since the boot block 22 is needed for booting the flash device 20, the MMIO logic 25 should not be mapped to the address range of the boot block at power up. However, after the boot sequence has been completed, the MMIO logic 25 can be mapped into the address range of the boot block 22, since the boot sequence is no longer needed.

In the example pertaining to the mapping of the configuration plane, a power on reset signal initiated to the flash memory device 20 will cause the control logic 26 to enable the MMIO logic 25 so that the configuration data utilized by the flash device 20 is mapped to the MMIO registers 29. In one embodiment the MMIO logic 25 can be mapped to the last block of the flash memory. Alternatively, in another embodiment the MMIO logic 25 can occupy the upper most block of the flash memory. However, as noted previously, the MMIO logic 25 can be mapped to most any block or blocks within the flash memory and not necessarily relegated to the top most or bottom most block or blocks.

Accordingly, at power on reset, the reset control signal to the CUI 27 will cause the boot code in the flash boot block to be read and executed by the processor/controller coupled to the flash device. When the configuration code is to be executed during the boot sequence, the configuration code is accessed. The configuration code is generally included as an application code in the boot block 22 or, alternatively, in one of the other blocks 21. When configuration parameters need to be stored, the data is written to the registers 29. Since the MMIO logic 25 is enabled, the configuration parameters can be mapped to the registers 29 by placing the appropriate address on the address line. Similarly, data can be read from the registers 29 as well. Accordingly, any reading of data or writing of data (if a particular register has read/write capability) can be achieved by the use of one or more of the registers 29, which are addressed by the address signal when the MMIO is enabled.

Again it is to be noted that the MMIO logic 25 is accessible by the address signal coupled through address latch 33. It is to be noted that additional address lines are not required when the MMIO logic 25 is part of the addressing scheme of the flash memory device 20. The MMIO logic circuit 25 when enabled is also capable of receiving address information as well as the data on line 32. The control signals on line 35 control the operation of the MMIO logic circuit 25, including the control of the state machine logic 28.

Figure 3:
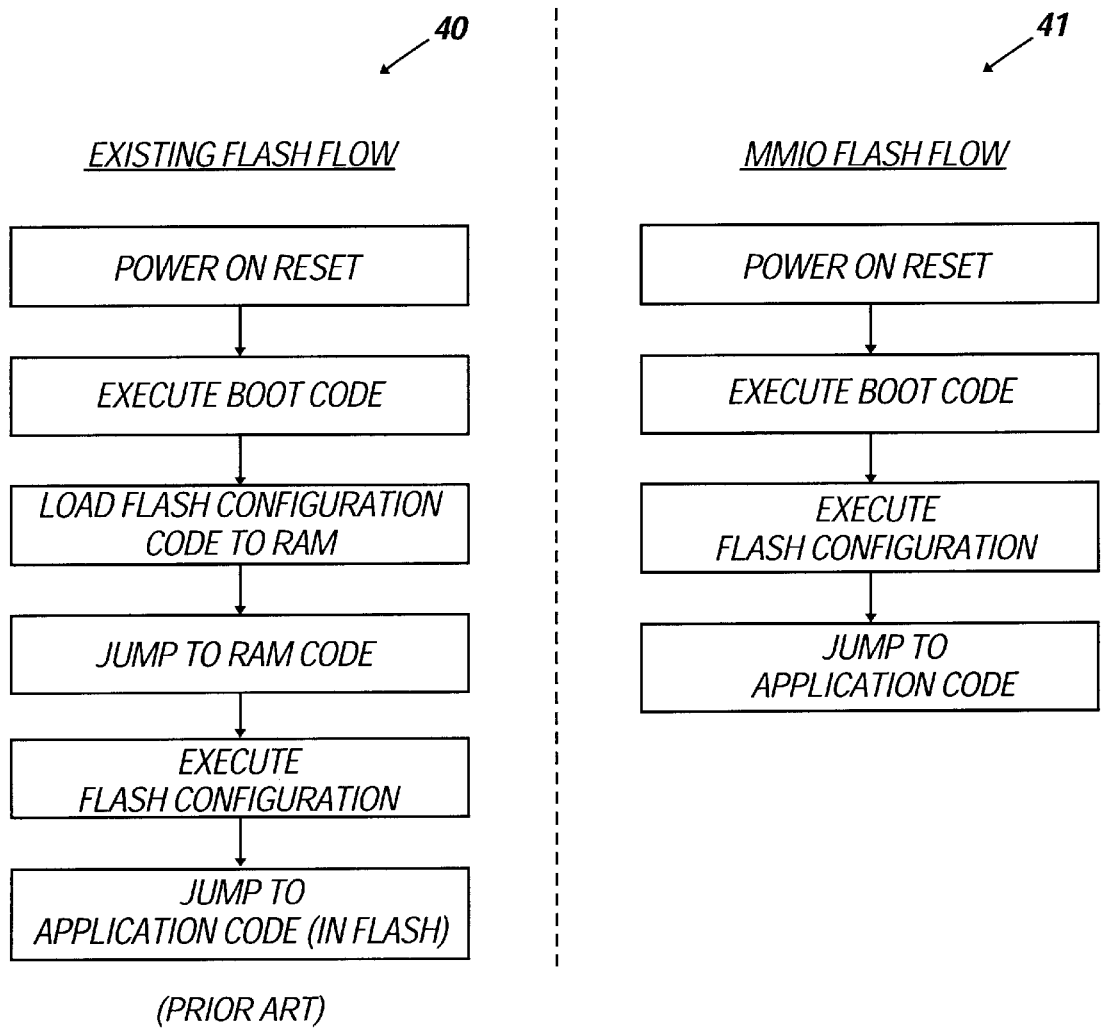
FIG. 3 is a flow diagram comparing differences in performing the flash configuration at power on reset between the MMIO flash device of an embodiment of the present invention and a prior art flash device.

FIG. 3 illustrates one example of a power on reset sequence when the MMIO is implemented versus the flash flow of an existing prior art flash device. As shown along the left portion of FIG. 3, a prior art flash flow 40 is shown to configure the flash device during an initialization boot routine at power on reset. Generally, a power on reset signal is initiated at which point the boot code is executed by the flash device. The boot code causes the flash configuration code to be loaded in the RAM as noted with the prior art technique in the background section above. The processor then jumps to the RAM code to execute the flash configuration and upon completing the flash configuration, the flash device then reverts to the flash read mode to operate on the next application code in flash.

The MMIO flash flow 41 of an embodiment of the present invention is shown along the right portion of FIG. 3 in which the power on reset signal causes the boot code to be executed. However, since the MMIO logic 25 is selected due to the MMIO enable, the flash configuration can be executed with the MMIO logic 25, without mapping the flash code to RAM. Once the flash configuration has been executed, the flash device then continues to the next application code in flash. It is to be noted that at boot up, the MMIO should not be mapped to the same address range as the boot block. However, once the boot process is completed, the MMIO could be mapped to the boot block address range, since the boot block 22 is no longer required once the system has booted.

Referring to FIG. 2 again, it is to be noted that a particular command on the control line 33 causes the MMIO Enable signal to be asserted, placing the MMIO logic 25 into the enabled state. That is, the MMIO enable signal is asserted or deasserted based on a particular command through the CUI 27. The power on reset can also enable the MMIO. When the MMIO is to be enabled, the control logic 26 generates corresponding MMIO control signals to operate on the state machine logic 28 so data can be operated on in the MMIO logic circuit 25. It is to be appreciated that the registers 29 can be registers specifically designated for use with the MMIO 25 or registers utilized for other functions of the flash which can be switched in to operate as registers 29 of the MMIO logic 25.

As noted above, the implementation of the MMIO logic circuit 25 allows the commands to be executed to access data in the flash blocks without moving the access code to memory. Because the state machine logic 28 and the registers 29 of the MMIO logic circuit 25 are switched into operate with designated instructions, registers 29 can provide read and/or write operations to directly access flash features, such as for configuration. Features, such as block-locking can be implemented to designate the locking or unlocking of blocks of the flash memory. For example, a register (or register bit) can be assigned to each flash block of the memory and in which the register value designates if the particular block is in a locked or unlocked condition. Other features or configurations include accessing the registers for security and/or device identification (which may include configuration features such as flash memory stepping voltages and other circuit parameters pertaining to the particular flash device). These various features, as well as others not listed here, can be configured in designated registers 29, so that the contents can be written/read for use configuring the flash. Therefore, the various data pertaining to features of the flash device, such as configuration information, are made available in the MMIO 25.

Aside from executing a flash configuration without first transferring code or data to external memory, the MMIO logic 25 of the present invention allows other functions to be performed. For example, interrupts can be handled by a handler instead of requiring the interrupt to be disabled. The problem associated with the interrupt handler is similar to that with the mapping of the configuration plane. That is, when writing to or erasing the flash memory, a particular flash status cannot be determined at the same time the flash has received the interrupt. Accordingly, flash status pertaining to the use of the flash memory cannot be determined without changing over to a status read mode.

Figure 4:
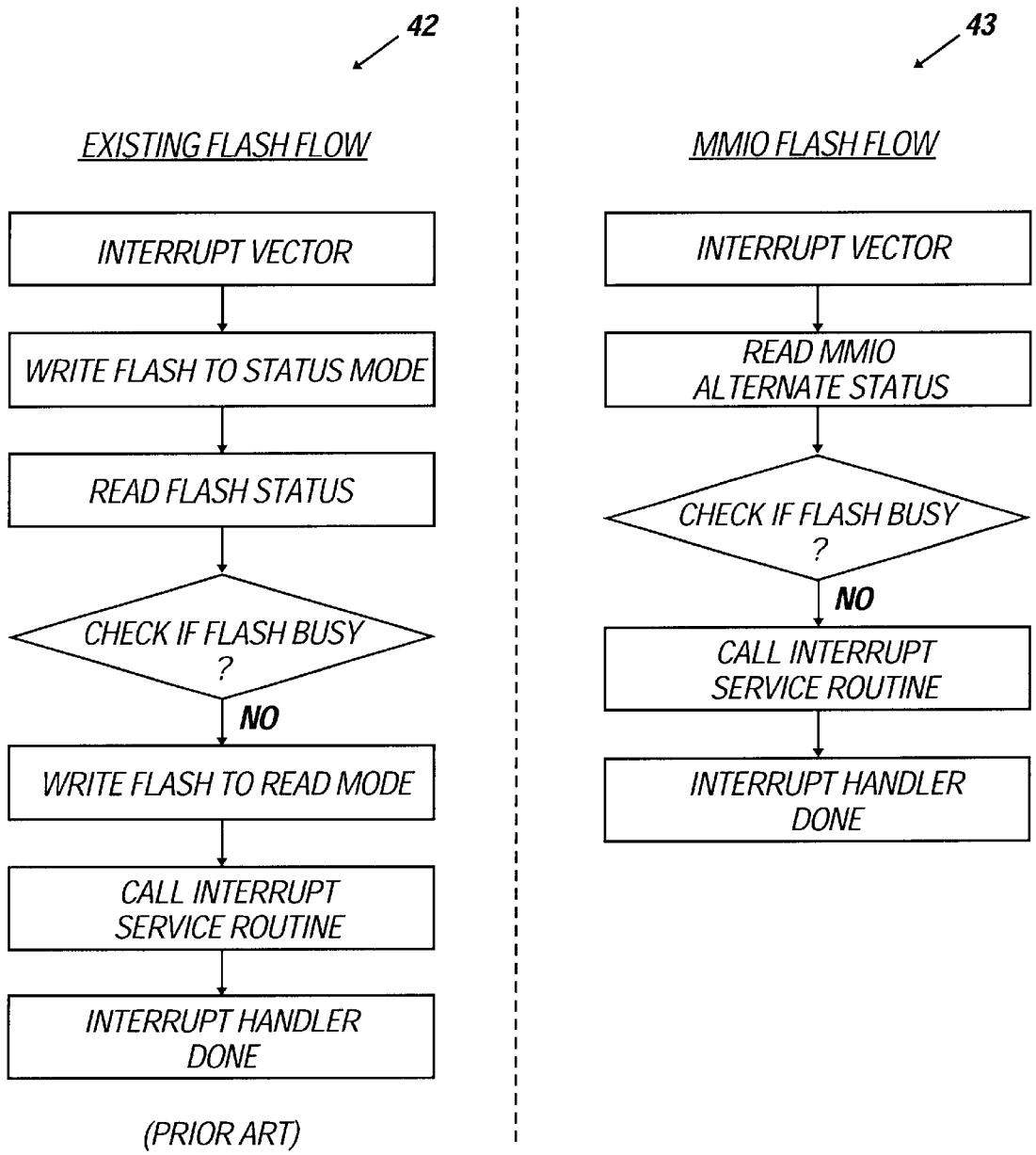
FIG. 4 is a flow diagram comparing differences in handling a flash interrupt between the MMIO flash device of an embodiment of the present invention and a prior art flash device.

As shown in FIG. 4, the prior art flash flow 42 for handling an interrupt vector is shown. Generally when an interrupt vector is encountered with the prior art flash device, the flash command is written to switch to the status mode. Then the status is read. If the status notes that it is not busy (the flash is not currently in use), then the flash is written again to place it in the flash read mode. Once the interrupt vector is read to be not busy, then the interrupt service routine is called and the interrupt is handled.

With an implementation of an embodiment of the MMIO, the two write steps (to switch to the status mode and then back to the read mode) are not required, since the status information can be placed into one of the MMIO registers 29 and read when an interrupt vector is noted. One of the registers 29 in the MMIO logic circuit 25, designated in the example of FIG. 4 as an alternate status register, holds a value which corresponds to busy/not busy status of the flash memory. This register value can be checked when the interrupt is received without switching a flash mode. The MMIO registers 29 can be accessed by the address signal when the MMIO logic circuit 25 is switched in. Subsequently, the interrupt service routine can be called to service the interrupt. This flow 43 is shown along the right portion of FIG. 4.

It should be noted that if the alternate status register notes that the flash is busy, then the flash memory is suspended first before handling the interrupt. By use of the alternate status register as one of the registers 29 in the MMIO logic 25, its content can be read to determine the status of the register without writing the flash to the status mode and writing to it again to return it to the flash read mode.

The above described aspect of the present invention provides a capability of manipulating registers 29 in the MMIO and also executing higher level commands through the CUI 27. With prior art devices, the flash memory needed to be written to in order to change command modes. Thus, a command was required to switch the flash out of the flash read mode to one of the other modes and a second command (flash read command) was needed to return the flash to the flash read mode. It could operate in the flash read mode or one of the other modes, but not both simultaneously. Accordingly, with prior art flash devices, the flash data was not accessible when the flash memory device was placed in a mode other than the flash read mode. Because of this reason, one prior art technique wrote the flash contents to memory, such as RAM, in order to be able to read flash data (which was code in the example) while in a non-flash read mode. However, with the presence of the NMIO in the flash memory, flash data can be manipulated in the registers 29 and also, higher level commands can now be executed, allowing for the flash memory data to be read while the flash executes a non-flash read command.

Because of the presence of read/write registers 29 in the MMIO logic 25, the flash memory device 20 can support sophisticated new commands via the MMIO plane. Some of these commands are noted in FIG. 5. These commands are shown for exemplary purpose and not to limit the extent of the commands available through the MMIO. It is appreciated that other commands can be readily executed through the control logic 26, whether through the CUI 27 or from a state machine to perform various operations on the flash memory. FIG. 5 identifies a number of specialized registers which are utilized to allow various commands to be executed, including higher level commands. The byte size noted with these registers are also again presented for exemplary purpose and could incorporate more or less bytes. The alternate status register has already been described in reference to the interrupt handling in that the alternate status register notes if the flash is busy or not busy.

In reference to the table in FIG. 5:

The alternate status register is used for executing write, next and copy commands. The value in the register identifies one status of the flash.

A write address register is used to hold the destination of the flash address for write and copy operations.

The write next register is utilized to program data to write address, update status and increment the address in the write address register.

A write hold register is used to program data to the write address and update the status of the status register.

A read address register is used to hold the source flash address for performing read next and copy commands.

A read next register is used in which the data is read at the read address and the read address is incremented thereafter.

A copy register is used to copy a length of bytes from the read address to a write address. A copy command is defined as a command that would copy a specific number of bytes from a source address to a destination address.

A length register holds the byte length for performing the copy operation.

A find register is used to initiate the find command. The find command is defined as a command that searches for a specific data image beginning at a specified address. The command could be operative either on a block level or at the device level. It is to be noted that a suspend/resume capability will more than likely be required should both the copy and find commands need to be interrupted.

A start address register identifies the flash address where the find of the find command begins. Instead of a separate start address, the read address register could be implemented as the start address register.

An image register holds the value to find during the find operation.

An image mask register is used to define the bit field mask of the image to find. Each bit within the image mask register acts as a mask to the equivalent bit in the image register. Any bits masked would not be compared during the find operation. For example, if image bits are 1011 and image mask bits are 0001, the pattern to be found is 101x, where x can be either 0 or 1.

An increment register is used to identify the byte boundaries to search during a find operation.

An end address register is used to define the end address for performing the find operation.

A stop value register contains the value which if found during the search terminates the find operation.

An instance count register to define the instance of the image to find.

An instances register to return the value of number of instances of the image found during the find operation.

A ready status register to indicate if the write or copy command has been completed. Bit masking to test a bit is not necessary, since status of the bit can be represented in a status register.

An error status register to indicate when a write or copy command had an error during its operation.

A write state machine (WSM) state register to return the current WSM state. The WSM state may be paused if a WSM state command is executed. It is generally known that a write state machine of a flash memory is an internal state machine which does writes and performs erases of the flash blocks. A write operation releases the WSM if the WSM state machine is paused during the execution of the WSM state command.

With the above example, the various registers can be read/written to provide values for use with various operations, as noted. The Find and Copy commands are higher level commands, which when received by the CUI would operate on the flash based on the values present in the corresponding registers noted above.

It is to be noted that various commands which would utilize these registers include alternate status read command, write command, write next command, write hold command, read command, read next command, copy command, find command, read ready status command, read error status command, and read/write WSM state command. When a particular command is to be executed various registers corresponding to that command are accessed to read/write data to define the parameters pertaining to that command. When registers are present for a specific parameter values can be stored in the registers to perform the particular command. The registers can be accessed by the address signals when the MMIO is enabled and/or dedicated to a particular command.

For example, with the higher level Copy command the read address register contains the address where the data is to be read while the write address register contains the write address where the data is to be written. The length register contains the byte length of the data which is to be copied starting at the read address. Accordingly, when the Copy command is received by the CUI, the appropriate registers are accessed so that a given length of data from one portion of the flash memory can be copied to another location of the flash memory. Without the presence of these MMIO registers 29, the higher level commands to the CUI would necessarily need to include this information. Accordingly, the utilization of the MMIO logic circuit 25 allows various commands, including higher level commands, to be executed by the flash memory device 20 without containing those parameters in the command instruction itself, since those parameters can be stored in the MMIO registers 29. Furthermore, the parameters can be readily changed for a given command simply by changing the parameter values in the corresponding registers 29.

Figure 6:
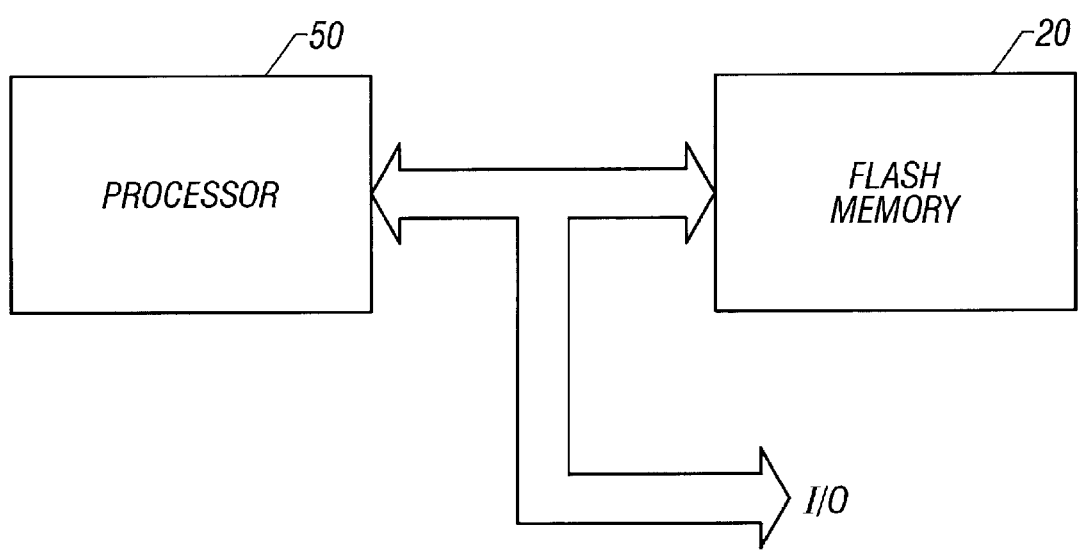
FIG. 6 is a block schematic diagram showing one system implementation which includes the use of a flash memory device of an embodiment of the present invention.

Referring to FIG. 6, it is appreciated that the flash memory device of the present invention can be utilized in a variety of different capacities. One figure is shown in FIG. 5 in which the flash memory device 20 is coupled to a processor (or controller) 50. The processor controls the operation of the flash memory 20 as well as utilizing the data present in the flash memory 20. In general application, the processor 50 along with the flash memory device 20 is coupled to other devices here shown as input/output (I/O), to exemplify a system in which the processor 50 and flash memory 20 are utilized.

In one configuration, the processor 50 and flash memory 20 are utilized in a cell phone in which the flash memory can store various information and programs typically used in a cell phone. The input operation includes various features, such as the inputting of telephone numbers and displaying the stored numbers when prompted by the phone user. When the cell phone is initially activated the processor will boot the flash 20 and also to configure the flash memory 20 pursuant to its configuration code. With the MMIO, the configuration operation can be performed without continually writing to the flash to switch modes. If interrupt handling is desired by the flash, then the interrupt handling sequence as described above can be implemented within the flash memory 20. Furthermore, if sophisticated higher level commands are desired (for example, those commands referenced in FIG. 5) then the flash memory can readily incorporate registers to store various parameters required for usage with those commands. It is appreciated that a variety of other systems, configurations and uses can be devised in order to utilize the flash memory device 20 incorporating the present invention.

It is appreciated that since the flash device incorporating the invention need not necessarily switch between modes to access flash data while performing another function, performance and speed is improved. Due to the presence of the MMIO components, including the MMIO registers to hold various parameters needed to identify features of the flash device, real-time flash access to flash memory features can be obtained by accessing the registers of the MMIO logic.

Thus, "Method and Apparatus to Provide Real-Time Access to Flash Features"0 is described.

I claim:

1. An apparatus comprising:
   a non-volatile memory in which at least a portion of said non-volatile memory is utilized for data storage; and
   a memory mapped input/output unit coupled to access non-volatile memory data when a particular condition is encountered, which condition is not a read command instruction to read said non-volatile memory.

2. The apparatus of claim 1 further comprising a control logic coupled to said memory mapped impact/output unit to respond to the particular condition when the condition is encountered, said control logic to enable said memory mapped input/output unit to access non-volatile memory data.

3. The apparatus of claim 2 in which the condition is a power on reset condition, wherein said memory mapped input/output unit is accessed for configuration information when executing configuration code during a boot sequence.

4. The apparatus of claim 1 in which the condition is initiated by writing a command other than the read command, in which said memory mapped input/output unit is accessed for real time data access.

5. The apparatus of claim 4 in which the condition is initiated by writing a find command, the find command defined as a command that searches for a specific data image beginning at a specified address.

6. The apparatus of claim 4 in which the condition is initiated by writing a copy command, the copy command defined as a command that copies a specific number of bytes from a source address to a destination address.

7. The apparatus of claim 1 in which said memory mapped input/output unit includes a plurality of registers to store data.

8. The apparatus of claim 7 in which said memory mapped input/output unit further includes a state logic machine to respond to the particular condition to control the registers.

9. The apparatus of claim 1 in which said memory mapped input/output unit is switched in as a portion of said non-volatile memory and accessed by addresses destined for said non-volatile memory.

10. The apparatus of claim 1 in which the condition is initiated when an interrupt occurs.

11. The apparatus of claim 1 in which the condition is initiated by writing a command other than the read command, in which said memory mapped input/output unit is accessed for real time data access.

12. A flash memory device comprising:
- a plurality of flash memory blocks, in which one or more blocks are utilized for data storage; and
- a logic circuit, coupled to said flash memory blocks, to operate as a memory mapped input/output logic to access flash memory data when a particular flash condition is encountered, which condition is not a flash read command instruction to read one of said flash memory blocks.

13. The flash memory device of claim 12 further comprising a control logic, coupled to said logic circuit, to respond to the particular flash condition when the condition is encountered, said control logic to enable said logic circuit to operate as the memory mapped input/output logic.

14. The flash memory device of claim 13 in which the condition is a power on reset condition, wherein said logic circuit is accessed for configuration information when executing configuration code during a boot sequence.

15. The flash memory device of claim 12 in which the condition is initiated by writing a command other than the flash read command, in which said logic circuit is accessed for real time data access.

16. The flash memory device of claim 15 in which the condition is initiated by writing a find command, the find command defined as a command that searches for a specific data image beginning at a specified address.

17. The flash memory device of claim 15 in which the condition is initiated by writing a copy command, the copy command defined as a command that copies a specific number of bytes from a source address to a destination address.

18. The flash memory device of claim 12 in which said logic circuit includes a plurality of registers to store data.

19. The flash memory device of claim 18 in which said logic circuit further includes a state logic machine to respond to the particular flash condition to control the registers.

20. The flash memory device of claim 12 in which said logic circuit is switched in as one of said flash memory blocks and accessed by addresses destined for the switched out block.

21. The flash memory device of claim 12 in which the condition is initiated when an interrupt occurs.

22. A method comprising:
- accessing a memory mapped input/output portion of a flash memory by addresses used to access the flash memory when a particular flash condition is encountered, which condition is not a flash read command instruction to read the flash memory, and to operate on memory mapped input/output accessed data in real time without writing a flash read command to the flash memory.

23. The method of claim 22 in which said memory mapped input/output accessing is achieved for configuration information.

24. The method of claim 23 in which the particular flash condition is a power on reset condition, wherein said accessing the configuration information is achieved when executing configuration code during a boot sequence.

25. The method of claim 22 in which the particular flash condition is initiated by writing a command other than writing the flash read command.

26. The method of claim 25 in which the particular condition is initiated by writing a find command, the find command defined as a command that searches for a specific data image beginning at a specified address.

27. The method of claim 25 in which the particular condition is initiated by writing a copy command, the copy command defined as a command that copies a specific number of bytes from a source address to a destination address.

28. The method of claim 22 in which the memory mapped input/output is switched in place of one of a plurality of memory blocks of the flash memory and accessing is achieved by addresses destined for the switched out block.

29. A machine-readable medium that provides instructions, which when executed by a machine, causes the machine to perform operations comprising:
- accessing a memory mapped input/output portion of a flash memory by addresses used to access the flash memory when a particular flash condition is encountered, which condition is not a flash read command instruction to read the flash memory, and to operate on memory mapped input/output access data in real time without writing a flash read command to the flash memory.

30. The machine readable medium of claim 29 wherein, the accessing of the memory mapped input/output is achieved for configuration information.

31. The machine-readable medium of claim 29 in which the particular flash condition is initiated by writing a command other than writing the flash read command.

32. A system comprising:
- a processor;
- a non-volatile memory coupled to said processor in which at least a portion of said non-volatile memory is utilized for data storage; and
- a memory mapped input/output unit coupled to access non-volatile memory data when a particular condition is encountered, which condition is not a read command instruction to read said non-volatile memory.

33. The system of claim 32 in which the condition is a power on reset condition, wherein said memory mapped input/output unit is accessed for configuration information when executing configuration code during a boot sequence.

* * * * *

UNITED STATES PATENT AND TRADEMARK OFFICE
CERTIFICATE OF CORRECTION

PATENT NO. : 6,549,482 B2
DATED : April 15, 2003
INVENTOR(S) : Garner

It is certified that error appears in the above-identified patent and that said Letters Patent is hereby corrected as shown below:

Column 7,
Line 55, delete "NMIO", insert -- MMIO --.

Signed and Sealed this

Twenty-third Day of September, 2003

JAMES E. ROGAN
*Director of the United States Patent and Trademark Office*